United States Patent [19]
Kawata et al.

[11] Patent Number: 5,438,276
[45] Date of Patent: Aug. 1, 1995

[54] APPARATUS FOR MEASURING THE LIFE TIME OF MINORITY CARRIERS OF A SEMICONDUCTOR WAFER

[75] Inventors: Yutaka Kawata; Takuya Kusaka, both of Kobe; Hidehisa Hashizume, Miki; Futoshi Ojima, Kobe, all of Japan

[73] Assignees: Kabushiki Kaisha Kobe Seiko Sho, Kobe; Leo Corporation, Tokyo, both of Japan

[21] Appl. No.: 59,764

[22] Filed: May 12, 1993

[30] Foreign Application Priority Data

May 14, 1992 [JP] Japan .................................. 4-121838
Nov. 27, 1992 [JP] Japan .................................. 4-318575

[51] Int. Cl.[6] .............................................. G01R 31/26
[52] U.S. Cl. ...................................... 324/765; 324/642
[58] Field of Search ............. 324/158 R, 158 D, 158 T, 324/73.1, 642, 702, 703, 95, 760, 765, 769, 158.1; 333/33, 253, 219; 250/310, 311

[56] References Cited

U.S. PATENT DOCUMENTS

| | | | |
|---|---|---|---|
| 3,939,415 | 2/1976 | Terasawa | 324/158 R |
| 4,087,745 | 5/1978 | Kennedy et al. | 324/642 |
| 4,704,576 | 11/1987 | Tributsch et al. | 324/158 R |
| 5,081,414 | 1/1992 | Kusama et al. | 324/642 |
| 5,138,255 | 8/1992 | Kusama et al. | 324/158 R |

Primary Examiner—Vinh P. Nguyen
Attorney, Agent, or Firm—Oblon, Spivak, McClelland, Maier & Neustadt

[57] ABSTRACT

An apparatus for measuring the life time of minority carriers includes a light source for irradiating a first region of a semiconductor wafer, a microwave generator for generating microwaves, a transmission line for transmitting a first part of the generated mark raised to the region of the semiconductor wafer that is radiated by the excitation light and a second portion of the generated microwave to a region of the semiconductor wafer that is not radiated by the excitation light. The intensity of the microwave signals reflected from the semiconductor wafer are detected and the life time of the minority carriers is calculated based upon the detected intensities.

13 Claims, 9 Drawing Sheets

APPARATUS FOR MEASURING THE LIFE TIME OF MINORITY CARRIERS OF A SEMICONDUCTOR WAFER

BACKGROUND OF THE INVENTION

1. Field of the invention

The present invention relates to a life time measuring apparatus for minority carriers of semiconductor wafers used for quality control of semiconductor wafers.

2. Description of the Prior Art

Along with an ultrahigh precision tendency in semiconductor devices represented by VLSI in recent years, severer quality control has come to be required for semiconductor wafers used in semiconductor devices. For such control, a noncontact type evaluation method is desirable which is free from contamination or damage to semiconductor wafers. As an example of a noncontact type evaluation method, a semiconductor characteristics measuring method using microwaves is well known (Japanese Patent Publication Sho-61-60576).

FIG. 8 is a typical view showing the schematic circuit configuration in an example of prior semiconductor characteristics measuring apparatus A0. FIG. 9 is a graph showing results from the semiconductor characteristics measuring apparatus A0.

As shown in FIG. 8, a prior semiconductor characteristics measuring apparatus consists of a specimen retention/transfer mechanism 47 (support base), an optical pulse generator 49 to irradiate optical pulses on the surface of the specimen 7 (semiconductor wafer) supported and transferred by the specimen retention/transfer mechanism 47, a gun oscillator 40 to generate microwaves to be radiated on the surface of the specimen 7, an impedance matching box 41 to regulate microwaves radiated from gun oscillator 40, a regulating mechanism 46 consisting of E-H tuners 42 and 44, magic T 3 and reflection-free terminal 43, waveguide 11 to radiate microwaves regulated by regulating mechanism 46 on the surface of the specimen 7, detector 45 to detect microwaves deflected on the surface of the specimen 7 by allowing it to pass again through waveguide 11 and regulating mechanism 46, and synchroscope 48 to display the change in the microwave detected by detector 45.

The measuring principle of said apparatus A0 is as follows:

In the specimen 7, majority carriers and minority carriers, free electron—positive hole pairs, are excited by optical pulse irradiated from optical pulse generator 49 the carrier concentration increases during light irradiation. On the other hand, between optical pulses where light irradiation is interrupted, excessive carriers (i.e., carrier concentration in excess of the carrier concentration at thermal equilibrium) gradually disappear due to recombination, decreasing carrier concentration. Such change in carrier concentration is remarkable on the minority carrier side. Since electric conductivity (specific resistance) of the specimen 7 changes according to change in carrier concentration, level change is caused in the microwave incident on the specimen 7. The microwave where level change is caused becomes a reflected wave to be transmitted to detector 45 through waveguide 11 and regulating mechanism 46. The reflected wave of the microwave detected here is displayed by synchroscope 48 as a damping curve. The life time of minority carriers of the specimen 7 can be measured from this damping curve.

In measuring the life time of minority carriers of the specimen 7 consisting of semiconductor wafers, it is necessary to carry out measurement without the effects of wafer thickness and wafer vibration in order to improve precision and to shorten measuring time. In other words, it is desired to conduct measurement without depending upon the distance between the opening end 6 of waveguide 11, a radiating end of microwaves, and the specimen 7.

FIG. 9 shows results of measuring the life time of minority carriers of silicon single crystal wafers (P and N types), specimen 7, with distance d between the opening end 6 of waveguide 11 and the specimen 7 as parameters. It is found that change in distance d has virtually no effect on measured results.

In said prior measuring apparatus A0, measurement not depending upon distance d between the opening end 6 of waveguide 11 and the specimen 7 may necessitate the following operations: removing unnecessary reflection from waveguide 11 having the opening end 6 with the use of two E-H tuners of regulating mechanism 46 and regulating the reflection quantity of microwaves from the specimen 7 variable depending upon a specific resistance of the specimen 7. In addition to what are respondable by said operations, however, there exist a multiple reflected wave between the opening end 6 and the specimen 7 and a reflected wave by a support base 47 for microwaves passing through the specimen 7. The quantity of these reflected waves vary depending upon specific resistance of the specimen 7. Therefore, in the specific resistance range of around twice that shown in FIG. 9, prior measuring system A0 is respondable, while for semiconductor wafers with a wide range of specific resistance, it is difficult to obtain constant measured results without depending upon distance d between the opening end 6 and the specimen 7.

In other words, specific resistance to measure semiconductor wafers usually covering a wide range from 1 to 100 Ωcm results in microwave amplitude reflectance from semiconductor wafers of a wide range of from 0.5 to 1.0. Since microwave reflectance variations due to carriers generated in semiconductor wafers when light is irradiated is extremely small, it is necessary to normally use tens of mW microwave power to radiate semiconductor wafers in order to catch signals to find the life time at high precision. On the other hand, unless input power to detector 45 is made below about 0.1 mW where the detection diode used for detector 45 has square-law characteristics, errors are caused in the measured values of life time due to nonlinear effect of the detection diode. In the microwave circuit configuration of said prior measuring apparatus A0, it was difficult to meet said detection diode input power range for semiconductor wafers with said wide-range specific resistance.

Furthermore, for measuring the intrinsic life time of semiconductor wafers at high precision, it is necessary to sufficiently reduce the quantity of minority carriers generated compared to originally existing majority carriers by reducing the quantity of light irradiated. However, reduced light quantity not only diminishes change in microwave reflectance in semiconductor wafers but also diminishes life time measuring signals obtained by detector 45. This made it difficult to measure by prior apparatus A0 semiconductor wafers with low specific resistance of below about 1 Ωcm.

SUMMARY OF THE INVENTION

The present invention has been made to solve said problem of prior art. Accordingly, it is an object of the present invention to provide a life time measuring apparatus for minority carriers of semiconductor wafers which is capable of measuring the life time of minority carriers of semiconductor wafers with a wide range of specific resistance at high precision and not sensitive to distance between said wafers and the radiating end of microwaves.

In order to achieve said object, in a life time measuring apparatus for minority carriers of semiconductor wafers including irradiating means for irradiating excitation light on said semiconductor wafers, radiating means for radiating microwaves on said semiconductor wafers, detecting means for detecting reflected waves or transmitted waves of microwaves radiated by said radiating means, and measuring means for measuring the life time of minority carriers of said semiconductor wafers corresponding to change in microwaves detected by said detecting means. The first invention is characterized in that a life time measuring apparatus for minority carriers of semiconductor wafers comprises branching means for halving microwaves radiated by said radiating means, first wave directing means for directing one of the microwave halved by said branching means to the irradiated portion by excitation light by said irradiating means for said semiconductor wafers, second wave directing means for directing the other half of the microwave branch to the nonirradiated portion of said semiconductor wafers, and having effective length different due to round trip of microwaves from said first wave directing means by as much as a half wavelength or the sum of a half wavelength and a factor integer of wavelength, and interfering means for allowing reflected waves or transmitted waves made incident by said first and second wave directing means to interfere with one another, and the change in reflected waves or transmitted waves of microwaves made to interfere by said interfering means is detected by said detecting means.

Two said detecting means may be established for comparing change signals detected by each said detecting means of reflected waves or transmitted waves of microwaves incident on said first and second wave directing means.

In a life time measuring apparatus for minority carriers of said semiconductor wafers including irradiating means for irradiating excitation light on semiconductor wafers, radiating means for radiating microwaves on said semiconductor wafers, detecting means for detecting reflected waves or transmitted waves of microwaves radiated by said radiating means, and measuring means for measuring the life time of minority carriers of said semiconductor wafers corresponding to change in microwaves detected by said detecting means. The second invention is characterized in that a life time measuring apparatus for minority carriers of semiconductor wafers comprises branching interfering means for halving microwaves radiated by said radiating means and allowing reflected waves or transmitted waves of said halved microwave to electromagnetically interfere with one another, and a pair of wave directing means for directing microwaves halved by said branching interfering means with the same effective length, and change in reflected waves or transmitted waves of the microwaves made to interfere by said branching interfering means when excitation light is irradiated by said irradiating means on either of portions on semiconductor wafers radiated by the microwave respectively directed by said pair of wave directing means is detected by said detecting means.

Amplifying means for amplifying change in reflected waves or transmitted waves of microwaves made to interfere by said branching interfering means may be established between said branching interfering means and said detecting means.

In addition, the effective lengths of both said wave directing means may be made to agree with each other by inserting thin metal plates having an opening of the same shape as that of said wave directing means into either one of said pair of wave directing means.

Furthermore, it is also possible to irradiate excitation light by shifting both irradiating means by establishing said irradiating means for each of said pair of wave directing means and making different from one another wavelengths of excitation light irradiated by each irradiating means.

According to the first invention, microwaves radiated by radiating means is halved by branching means. When one of the microwave halved by said branching means is directed by the first wave directing means to the portion irradiated by excitation light by irradiating means for semiconductor wafers, level change is caused. On the other hand, when the other half of the microwave is directed to the nonirradiated portion of excitation light by irradiating means for said semiconductor wafers by second wave directing means having effective length different due to round trip of microwaves from said first wave directing means by as much as a half wavelength or the sum of a half wavelength and a factor integer of wavelength, no level change is caused. Reflected waves or transmitted waves of microwaves incident on said first and second wave directing means are made to interfere with one another by interfering means. This interference enables unnecessary waves other than reflected waves or transmitted waves in which level change is caused by the irradiation of said excitation light to be eliminated. Said unnecessary waves are multiple reflected waves between a radiating end of microwaves and said semiconductor wafers, reflected waves by the supporting base of microwaves passing through said semiconductor wafers, etc. Their quantity varies depending upon specific resistance of semiconductor wafers and distance between said wafers and the radiating end of microwaves. Only change in reflected waves or transmitted waves of microwaves in which level change is caused by the irradiation of said excitation light is detected by detecting means. In this way, when excitation light is irradiated on the surfaces of semiconductor wafers, signals of change in reflected waves or transmitted waves of microwaves caused by this irradiation can be detected with high S/N ratios.

Since these signals of change correspond to the life time of minority carriers of semiconductor wafers, said life time will be measured by processing said signals by said measuring means.

As a result, the life time of minority carriers of semiconductor wafers having a wide range of specific range of specific resistance can be measured with high precision.

In addition, when two said detecting means may be established and each of them may detect change in reflected waves or transmitted waves of microwaves incident on said first and second wave directing means, output signals of each said detecting means are compared with each other by comparing means instead of said interfering means and the life time of minority carriers of semiconductor wafers can be measured by said comparing means as well as said interfering means.

According to the second invention, branching interfering means for halving microwaves radiated by radiating means and for allowing reflected waves or transmitted waves of said halved microwave to electromagnetically interfere with one another and a pair of wave directing means for directing the microwave halved by said branching interfering means having the same effective length may be established. When excitation light is irradiated by said irradiating means on either of portions on semiconductor wafers radiated by microwaves respectively directed by said pair of wave directing means, level change is caused only in the microwave radiated on the irradiated portion. Unnecessary waves other than reflected waves or transmitted waves of the microwave in which level change is caused by the irradiation of said excitation light are eliminated from reflected waves or transmitted waves of microwaves incident on said pair of wave directing means by electromagnetically interfering with one another by said branching interfering means. In other words, in the second invention, since said pair of wave directing means have the same effective length, reflected waves or transmitted waves of microwaves incident on said branching interfering means via respective wave directing means have the same phase, generating electric fields corresponding to respective levels of reflected waves or transmitted waves of microwaves. Output waves fetched from the output side where acting direction of these electric fields is totally reverse become proportional only to level change in microwaves by the irradiation of said excitation light, thereby eliminating said unnecessary waves.

As a result, as is the case with said first invention, life time of minority carriers of semiconductor wafers having a wide range of specific resistance can be measured with high precision without being affected by distance between said wafers and the radiating end of microwaves.

In addition, when amplifying means for amplifying said output waves corresponding to change in reflected waves or transmitted waves of microwaves made to interfere by said branching interfering means is established between said branching interfering means and detecting means, detection precision of small output waves can be improved, further improving measuring precision of life time of minority carriers. Thus, measuring life time of minority carriers of semiconductor wafers having low specific resistance of 1 Ωcm which has been difficult so far becomes possible.

Furthermore, effective lengths of said wave directing means can be made to agree by inserting thin metal plates having an opening of the same shape as that of said wave directing means into either of said pair of wave directing means. Because of the ease of adjusting effective length of wave directing means, processing precision of the apparatus is not required very much, thereby enabling the apparatus to be simplified.

In addition, when said irradiating means is established in each of said pair of wave directing means and excitation light is irradiated by shifting both irradiating means by making different wavelengths of excitation light irradiated by each irradiating means, the need for transferring or replacing irradiating means is eliminated when the life time of minority carriers of semiconductor wafers is measured separately from a recoupling phenomenon caused in the surface of semiconductor wafers, thus enabling high-speed measurement.

While the specifications concludes with a claim particularly pointing out and distinctly claiming the subject-matter of the invention, it is believed that the invention will be better understood from the following description taken in connection with the accompanying drawings herewith:

DETAILED DESCRIPTION OF THE PREFERRED EMBODIMENTS

While only certain preferred embodiments of the present invention have been described, it will be apparent to those skilled in the art that various changes and modifications may be made therein without departing from the spirits and scope of the present invention.

Figure 1:
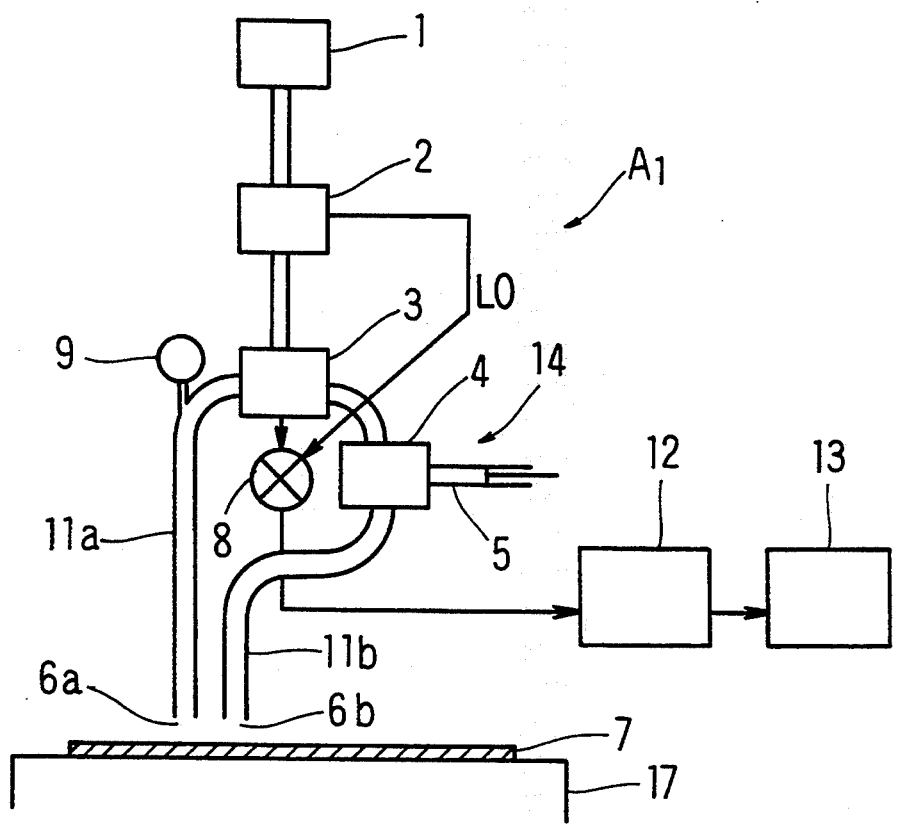
FIG. 1 is a typical view showing the schematic circuit configuration of semiconductor characteristics measuring apparatus A1 according to the first preferred embodiment of the first invention.

As shown in FIG. 1, semiconductor characteristics measuring apparatus A1 according to the first preferred embodiment of the first invention mainly consists of support base 17, laser 9 for irradiating a laser pulse beam on the surface of the specimen 7 (semiconductor wafer) supported by support base 17 (corresponding to irradiating means), microwave generator 1 for generating microwaves to radiate on the surface of the specimen 7 (corresponding to radiating means), branching separator 2 for halving microwaves radiated by microwave generator 1 (corresponding to branching means), a first transmission line 11a for directing one of the microwaves halved by branching separator 2 to the portion of the specimen 7 irradiated by a laser pulse beam (corresponding to first wave directing means), second transmission line 11b for directing the other half of the microwave to the portion of the specimen 7 not irradiated by a laser pulse beam (corresponding to second wave directing means), line length variable mechanism 14 for changing the length of the second transmission line, mixer 8 having the function to allow reflected waves of microwaves respectively incident on the first and second transmission lines to interfere with one another (corresponding to interfering means) and the function to detect change in these interference waves (corresponding to detecting means), waveform processing circuit 12 for processing detection signals by mixer 8 (corresponding to measuring means), and life time display 13 for displaying the life time of minority carriers of the specimen 7, output of waveform processing circuit 12.

Line length variable mechanism 14 consists of circulator 4 for changing the traveling direction of microwaves and short-circuit plate 5 for allowing microwaves entered by changing its traveling direction by circulator 4 to reflect at a given position, adjusting effective length of wave entered the second transmission line by short-circuit plate 5. A pore is provided in the first transmission line 11a, through which a laser pulse beam generated by laser 9 is irradiated on the surface of the specimen 7 from the first transmission line 11a.

The basis measuring principle of said semiconductor characteristics measuring apparatus A1 being the same as prior examples, the description will be omitted.

The operation procedure for apparatus A1 is described as follows, firstly on measuring preparations.

During this time, a laser pulse beam from the laser 9 is not irradiated, and microwaves halved by branching separator 2 are respectively directed to the first and second transmission lines 11a and 11b via magic T 3 and radiated on the specimen 7 from the opening ends 6a and 6b of each line. Microwaves reflected on the surface of the specimen 7 are re-entered into corresponding transmission lines (i.e., entered into radiated transmission lines) to be directed to mixer 8. Microwaves directed to a mixer 8 are allowed to interfere one another. At this time, microwaves respectively entered into the first and second transmission lines 11a and 11b are adjusted by line length variable mechanism 14 to have effective length (round trip path length) different from each other by half a wavelength. When a laser pulse beam is not irradiated, microwaves respectively directed into mixer 8 via the first and second transmission lines 11a and 11b are of the same level and different from each other by half a wavelength. Therefore, as a result of interference in mixer 8, microwaves completely disappear and are eliminated. The mixer receives a local oscillator signal (LO) from the separator 2.

The next description is given of measuring time. During this time, a laser pulse beam by laser 9 is irradiated through a pore provided in transmission line 11a locally on the surface of the specimen 7 from the first transmission line 11a. As is the case with said measuring preparation time, halved microwaves are radiated respectively via the first and second transmission lines 11a and 11b. Reflected waves on the specimen 7 are respectively redirected to mixer 8 via the first and second transmission lines 11a and 11b to be allowed to interfere here.

At this time, the level of microwaves via the first transmission line 11a in a laser pulse beam irradiation state is different from that of second transmission line 11b in a nonirradiation state. Therefore, microwaves do not disappear even if they are allowed to interfere in mixer 8.

Here, the quantity of unnecessary reflected waves from the first and second transmission lines 11a and 11b and unnecessary reflected waves such as multiple reflected waves between the opening ends 6a and 6b of both lines 11a and 11b and the specimen 7 transmitted to line 11a is equivalent to that transmitted to line 11b. This enables unnecessary reflected waves to be eliminated in mixer 8 like reflected waves of microwaves in said measuring preparation time.

However, waves reflected on support base 17 of microwaves transmitted through the specimen 7 are not eliminated as stated before. In other words, since in a portion irradiated by a laser pulse beam, carriers are excited so that the surface of the specimen 7 becomes close to a state of metal, most of radiated microwaves are reflected on this surface and fail to reach support base 17. Therefore, reflected waves from support base 17 at this portion are negligible. On the other hand, reflected waves by support base 17 exist in the laser pulse beam nonirradiated portion. For this reason, in mixer 8, reflected waves which have produced level change similar to reflected waves on the surface of the specimen 7 in said measuring time, and reflected waves which have produced no level change but have their phase dislocated by half wavelength of microwaves overlap with reflected waves which have produced no level change but have their phase dislocated from said half wavelength further by about twice the thickness of the specimen. However, since waves at this portion reflected on support base 17 produce no level change, it is unlikely to eliminate reflected waves from the laser pulse beam irradiated portion. Furthermore, effect by the dislocation of phase is actually negligible. Therefore, such effect by reflected waves from support base 17 is negligible.

Thus, when a laser pulse beam is irradiated on the surface of the specimen 7, signals of change in reflected waves caused only in transmission line 11a (signals necessary for correctly measuring the life time) can be detected with high S/N ratios.

As a result, the life time of minority carriers of semiconductor wafers having a wide range of specific resistance can be measured with high precision.

In said measurement, in order to improve the precision, it is necessary to put close the opening ends 6a and 6b as if their carrier concentrations were equivalent. When this poses a problem of so-called cross talk where microwaves enter into the other side between the opening ends 6a and 6b, it is effective to establish a thin metal plate or a wave absorber for electromagnetic wave shielding between the opening ends 6a and 6b.

Figure 2A:
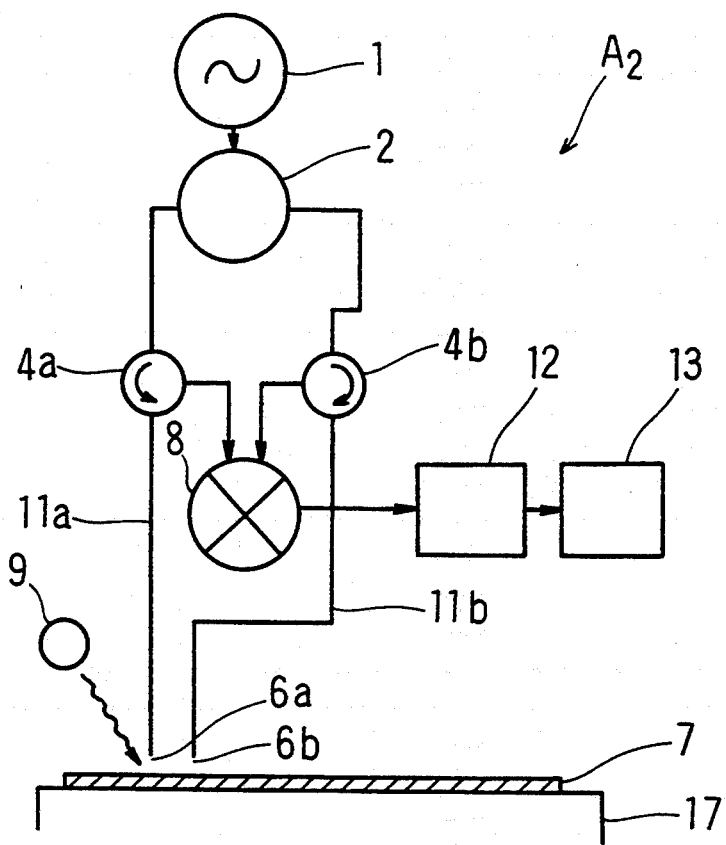
FIG. 2 is a typical view showing the schematic circuit configuration and a partially expanded view of semiconductor characteristics measuring apparatus A2 according to the second preferred embodiment of the first invention.
Figure 2B:
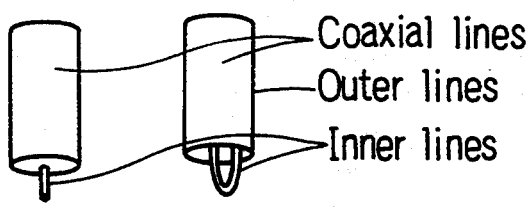

Measuring apparatuses A2 to A4 according to the other preferred embodiments of the first invention will be described while making reference to FIGS. 2 to 4.

In said first preferred embodiment, measuring apparatus A1's circuit consists of two transmission lines, while a circuit can also be similarly composed with coaxial lines 11a and 11b. FIG. 2 shows measuring apparatus A2 in the second preferred embodiment, an example where coaxial lines are used. Here, coaxial lines where the opening ends 6a and 6b serving as rod antennas or loop antennas are closely located. The difference between both line lengths (lines between branching separator 2 and circulators 4a and 4b) is adjusted so that unnecessary reflection from antennas and multiple reflected waves between antennas and the specimen 7 can be eliminated. However, with coaxial lines, magic T 3 is not used in circuit configuration as in measuring apparatus A1. Instead of line length variable mechanism 14, configuration may be made so that one line is looped to obtain effective length different from that of the other line. Measuring apparatus A2 enables transmission lines, round trip path for microwaves, to be thinner, resulting in the minimization of the entire circuits.

In said first and second apparatuses, each circuit is located to eliminate unnecessary reflected waves on microwave circuits, their circuit lengths being different from each other by half a wavelength of microwaves.

Figure 3:
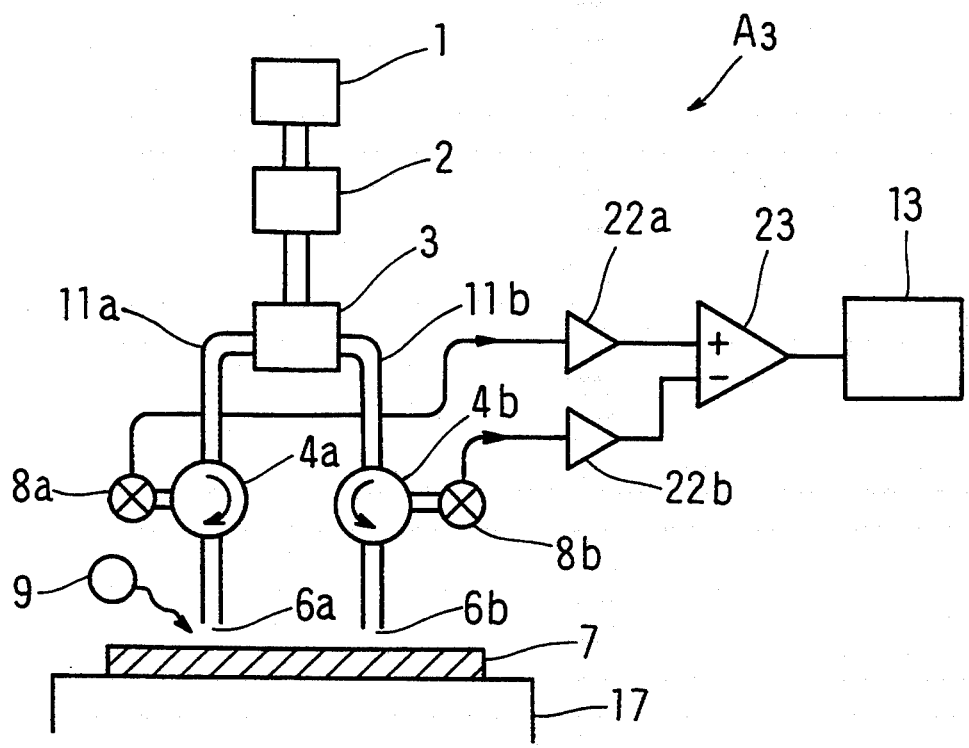
FIG. 3 is a typical view showing the schematic circuit configuration on semiconductor characteristics measuring apparatus A3 according to the third preferred embodiment of the first invention.

As shown in FIG. 3, on the other hand, in measuring apparatus A3 in the third preferred embodiment, detectors 8a and 8b are located respectively in the two circuits irrespective of the two microwave circuit lengths. In other words, two microwave electric signals detected by detectors 8a and 8b are adjusted by amplifiers 22a and 22b so that levels thereof become the same, and then unnecessary power is canceled by differential amplifier 23 (corresponding to comparing means). Thus, only change in reflected wave signals from the specimen 7 by a laser pulse beam is extracted. At this time, all signal power by unnecessary reflection from the opening ends 6a and 6b of the first and second transmission lines, reflected waves from the specimen 7, multiple reflected waves between the opening ends 6a and 6b and the specimen 7 and reflected waves of microwaves from support base 17 which has passed through the specimen 7 is canceled.

Thus, when a laser pulse beam is irradiated on the surface of the specimen 7, signals of change in reflected waves caused only in one of the two transmission lines (signals necessary for correctly measuring the life time) can be detected with high S/N ratios.

As a result, the life time of semiconductor wafers having a wide range of specific resistance can also be measured with high precision like said measuring apparatuses A1 and A2.

Figure 4:
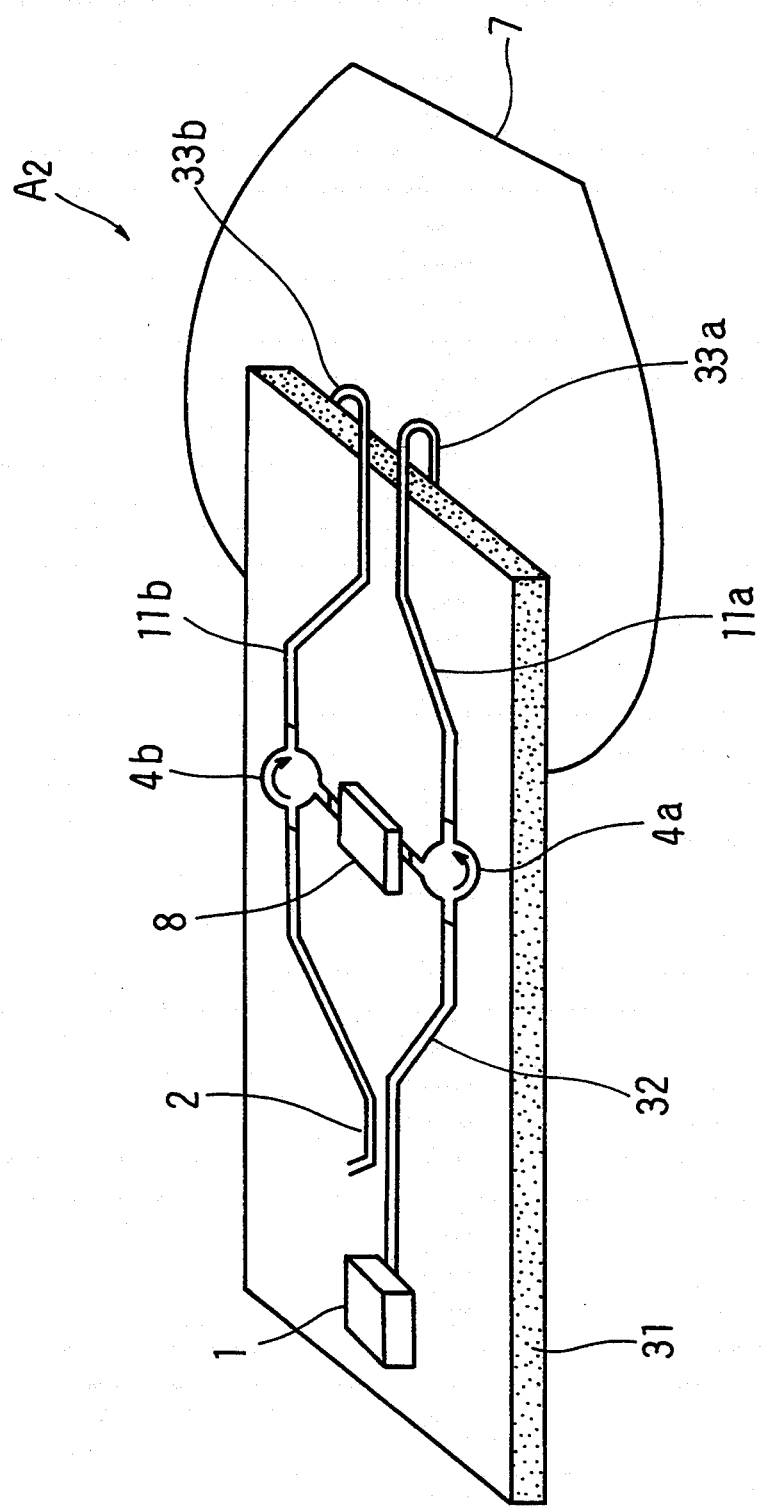
FIG. 4 is a typical perspective view showing a case where semiconductor characteristics measuring apparatus A2 is mounted on a strip line.

FIG. 4 shows measuring apparatus A2 according to the second preferred embodiment in which microwaves circuit is mounted on a strip line. While the circuit is equivalent to the one shown in FIG. 2, configuration by a strip line enables by far remarkable miniaturization of the apparatus compared with a circuit by waveguides and transmission lines.

Furthermore, since no adjusting operations by an E-H tuner, etc. in prior examples are required, maintainability can be improved. In addition, miniaturization in the apparatus can be achieved because eliminated need for adjustment enables the circuit system to be expanded not only to previous waveguides and transmission lines but also to coaxial lines and strip lines shown in FIGS. 3 and 4.

In said apparatuses A1 to A3, while the length between two transmission lines is varied by half a wavelength of effective length of microwaves traveling in each line, change to the sum of a half wavelength and a factor integer of wavelength will cause no trouble in actual use.

In said apparatuses A1 to A3, while the effective length is varied in the second transmission line side, change in the first transmission line side will cause no trouble in actual use.

Figure 5:
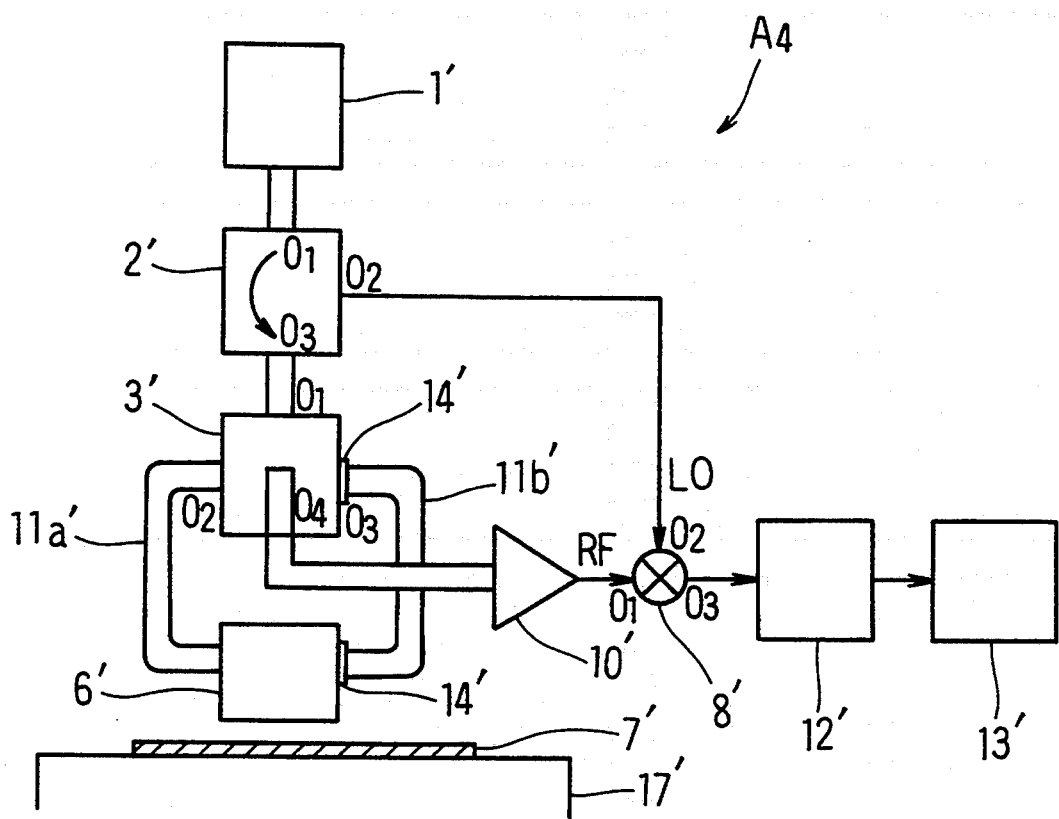
FIG. 5 is a typical view showing the schematic circuit configuration of semiconductor characteristics measuring apparatus A4 according to the first preferred embodiment of the second invention.

Secondly, as shown in FIG. 5, semiconductor measuring apparatus A4 according to the first preferred embodiment of the second invention mainly consists of support base 17'laser 9a' for irradiating a laser pulse beam on the surface of the specimen 7' (semiconductor wafer) supported by support base 17' (corresponding to irradiating means), microwave generator 1' for generating microwaves to radiate on the surface of the specimen 7' (corresponding to radiating means), magic T 3' which halves microwaves radiated by microwave generator 1' and allows reflected waves of halved microwaves to electromagnetically interfere each other (corresponding to branching interfering means), a pair of transmission lines 11a' and 11b' which direct microwaves halved by magic T 3' with the same effective length (corresponding to a pair of wave directing means), amplifier 10' for amplifying output waves corresponding to change in microwaves interfered by magic T 3' when a laser pulse beam is irradiated by laser 9a' on transmission line 11a' in portions on the specimen 7' radiated by microwaves respectively directed by transmission lines 11a' and 11b' (corresponding to amplifying means), mixer 8' for detecting output waves amplified by amplifier 10' (corresponding to detecting means), waveform processing circuit 12' for processing detection signals by mixer 8' (corresponding to measuring means) and life time display 13' for displaying the life time of minority carriers of the specimen 7', output of waveform processing circuit 12'.

In apparatus A4, circulator 2' for generating standard signals (LO signals) is located instead of branching separator 2 in said apparatus A1. In addition, antenna 6' is located on the opening side of transmission lines 11a' and 11b'.

The basic principle of said semiconductor characteristics measuring apparatus A4 is also the same as in prior examples.

The operation procedure for apparatus A4 is described as follows while making reference to FIG. 5 and FIGS. 6(a) to (d).

Figure 6A:
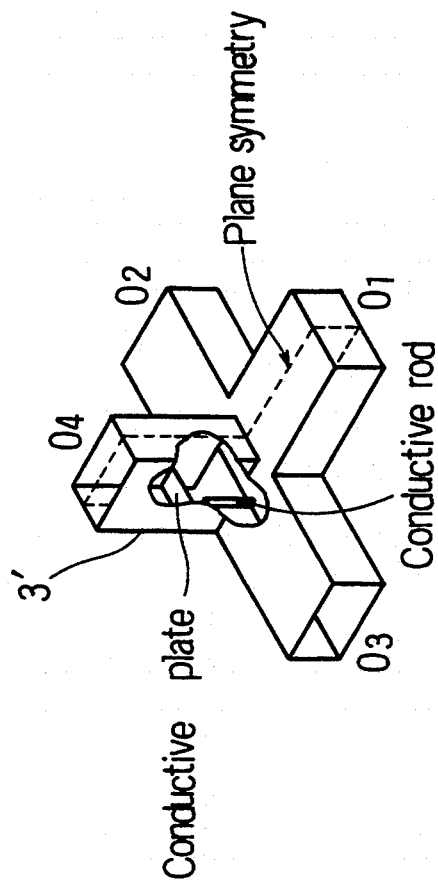
FIG. 6(a) to (d) are schematics showing the apparatus A4 according to the second preferred embodiment of the second invention.
Figure 6B:
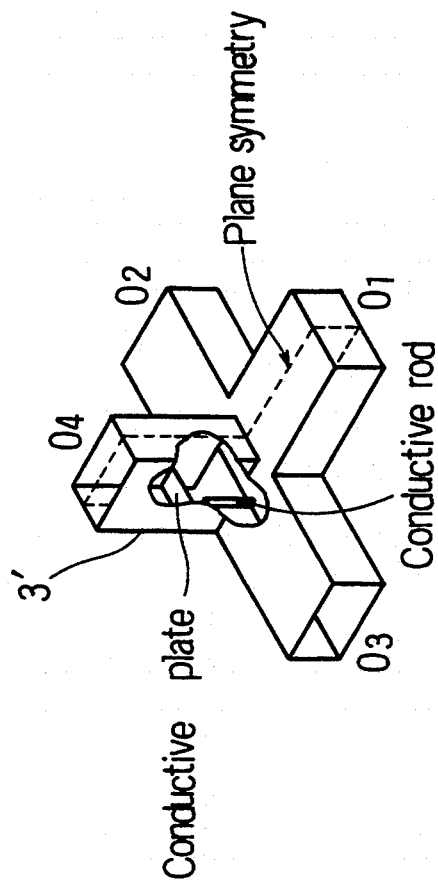
Figure 6C:
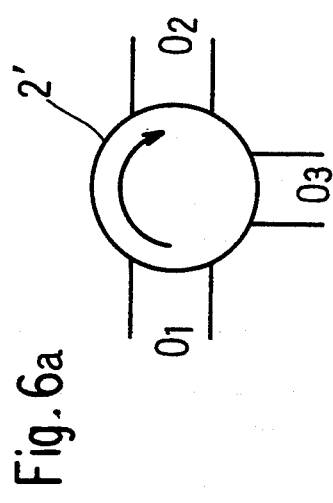
Figure 6D:
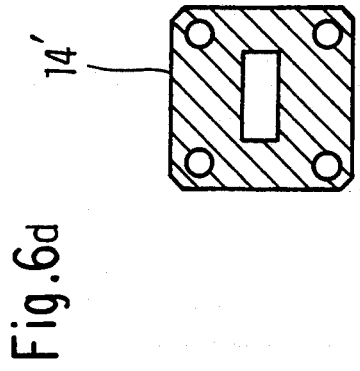

Firstly, during measuring preparation time, a laser pulse beam by laser 9a' is not irradiated, and microwaves generated by microwave generator 1' are directed to opening 01 of circulator 2' shown in FIG. 6(a). These microwaves are input from opening 02 of circulator 2' to H branch output opening 01 of magic T 3' shown in FIG. 6(b). The microwaves input to opening O1 of magic T 3' are halved in magic T 3'. Microwaves respectively fetched from two H surface T branch openings 02 and 03 of magic T 3' are directed to a pair of transmission lines 11a' and 11b', which are radiated on the specimen 7' from antenna 6' shown in FIG. 6(c). Reflected waves from the specimen 7' are redirected to magic T 3' via transmission lines 11a' and 11b'. Microwaves directed to magic T 3' are allowed to interfere here electromagnetically. In other words, since in apparatus A4, a pair of transmission lines 11a' and 11b' have the same effective lengths, reflected waves of microwaves incident on magic T 3' via transmission lines 11a' and 11b' become of the same phase. Electric fields corresponding to respective levels of reflected waves of these microwaves are generated. Acting directions of electric fields viewed from E branch output opening 04 of magic T 3' are reverse to one another, and a combined wave (output wave) of both radiated waves of microwaves from this E branch output opening 04 is fetched. Here, in order to make effective lengths of transmission lines 11a' and 11b' equal, thin metal plates 14' having an opening the same in shape with the one in transmission line 11b' shown in FIG. 6(d) are inserted in transmission line 11b'. The insertion of the metal plates 14' enables the difference in effective length between both transmission lines resulting from processing errors to be adjusted. Various thicknesses are available for thin metal plates 14', and ones with adequate thickness are selected for insertion. In this way, said difference is correctly adjusted, thus making the phase difference of both said reflected waves zero. Then, as a result of interference in magic T 3', both reflected waves are eliminated. In other words, output power of an output wave fetched from E branch output opening 04 of magic T 3' becomes zero.

During the measuring time, a laser pulse beam by laser 9a' is locally irradiated on the surface of the specimen 7' from antenna 6' through a pore provided on transmission line 11a' side of antenna 6'. Microwaves halved in the same way as during said measuring time are radiated via a pair of transmission lines 11a' and 11b'. Reflected waves from the specimen 7' are directed to magic T 3' respectively via transmission lines 11a' and 11b' and allowed to interfere here.

At this time, the level of microwaves directed via transmission line 11a' in a laser pulse beam irradiation state is different from the level of microwaves directed via transmission line 11b' in a nonirradiation state. Therefore, microwaves which are allowed to interfere in magic T 3' are unlikely to disappear. In other words, since microwave reflectance is changed by carriers generated in the laser pulse beam irradiated portion of the specimen 7', an output wave signal corresponding to carrier change by optical excitation due to lost balance is generated. This signal is amplified by amplifier 10' and input to RF terminal 01 of mixer 8' as an RF signal. The sum of reflected waves from antenna 6' is constantly generated in H branch output opening 01 of magic T 3'. This sum is input as an LO signal to LO terminal 02 of mixer 8' from opening 02 of circulator 2' via 03. The microwave amplitude changed by carriers excited by a laser pulse beam can be observed in output opening 03 of mixer 8' by overlapping an RF signal with an LO signal in mixer 8'. Output signals of mixer 8' are fetched into waveform processing circuit 12. The data is processed, whose results are displayed on the life time display 13'.

Here, unnecessary reflected waves from transmission lines 11a' and 11b', multiple reflected waves between the antenna 6' and the specimen 7' and unnecessary reflected waves such as those from support base 17' can be completely eliminated or ignored for the same reason as for said apparatus A1.

Thus, change in reflected waves caused only in transmission line 11a' can also be detected by apparatus A4 with high S/N ratios when a laser pulse bean is irradiated on the surface of the specimen 7', the life time of minority carriers of semiconductor wafers having a wide range of specific resistance can be measured with high precision.

As a result, it is also possible to measure the life time of minority carriers of the specimen 7' having a low specific resistance of below 1 Ωcm which has so far been difficult to measure.

In addition, since effective lengths of a pair of transmission lines 11a' and 11b' can be made to agree by inserting into transmission line 11b' thin metal plates 14' having an opening the same in shape as the one in transmission line 11b', processing precision of the apparatus is not required very much, leading to the simplification thereof.

Figure 7:
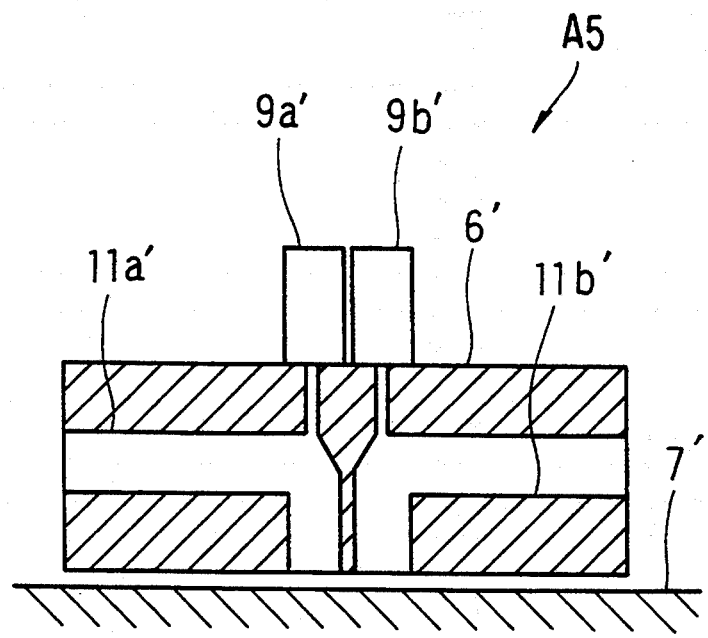
FIG. 7 is a typical view showing the periphery of the antenna of semiconductor characteristics measuring apparatus A5 according to the second preferred embodiment of the second invention.
Figure 8:
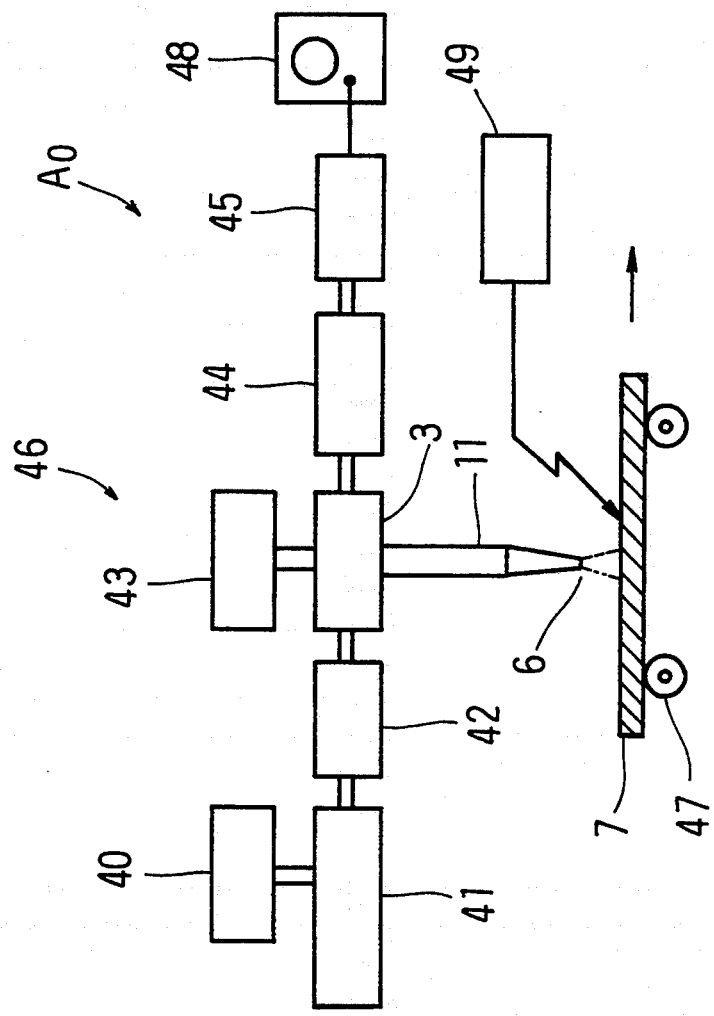
FIG. 8 is a typical view showing the schematic circuit configuration in an example of a prior semiconductor characteristics measuring apparatus A0.
Figure 9:
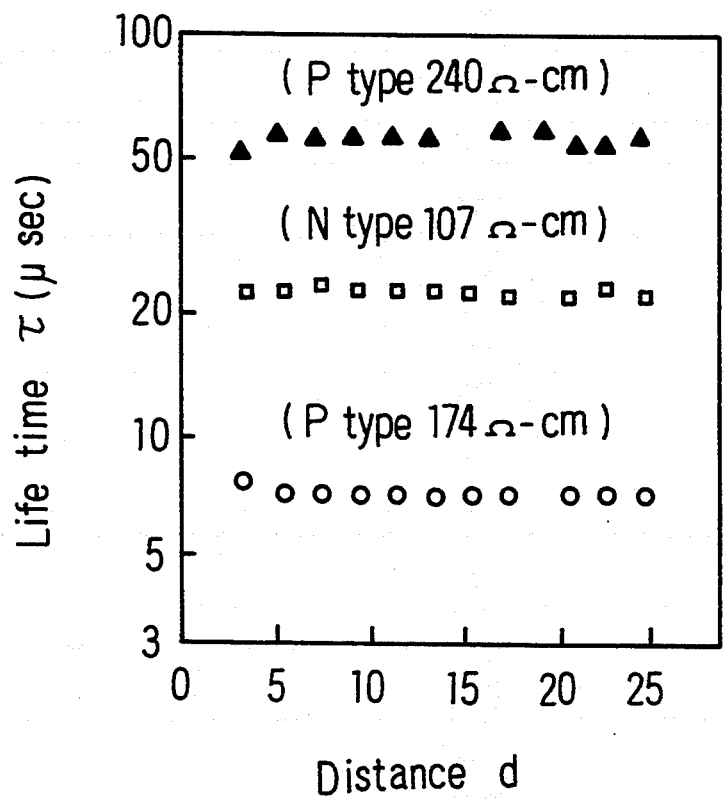
FIG. 9 is a graph showing measure results by semiconductor characteristics measuring apparatus A0.

Now, an apparatus A5 according to the second preferred embodiment of the second invention will be described while making reference to FIG. 7.

It is well known that the difference in wavelength of excitation light results in a difference in penetration depth by excitation light into semiconductor wafers, causing the difference in distribution of generated carriers in depth direction. Therefore, the use of data of different excitation light wavelength leads to an advantage that the life time of wafer bulk can be separated from the recoupling life time on the wafer surfaces. Since said apparatus A4 provided only one laser 9a', laser 9a' was mechanically transferred to the upper part of the pore provided on transmission line 11a' side or replaced when the life time is measured. In the apparatus A5, lasers 9a' and 9b' which generate laser pulse beams different in wavelength from each other are located on both sides (transmission line 11a' side and transmission line 11b' side) of antenna 6' as shown in FIG. 7. The configuration other than the periphery of antenna 6' is the same as that of said apparatus A4. Data can be collected without replacing or transferring lasers themselves when lasers 9a' and 9b' of apparatus A5 are shifted and laser pulse beams are irradiated on the specimen 7'.

Therefore, the life time at each measuring point of the specimen 7' can be measured at high speed. However, since there are two positions on which microwaves are radiated from antenna 6' and there is some distance between them, it is necessary to separately conduct coordinate operation for data and microwave radiating positions after collecting data.

While in said apparatus A4, laser 9a' was located on the transmission line 11a' side of antenna 6', no trouble will be caused when laser 9a' is located on transmission line 11b' side in actual use.

While in said apparatus A4, the effective length was adjusted by inserting thin metal plate 14' into transmission line 11b', no trouble will be caused when thin metal plate 14' is inserted into transmission line 11a' in actual use.

While in said apparatuses A1 to A5, the life time of minority carriers of the specimen 7(7') is measured using reflected waves of microwaves, no trouble will be caused when transmitted waves of microwaves are used in actual use.

What is claimed is:

1. An apparatus for measuring the life time of minority carriers of a semiconductor wafer, comprising:
    irradiating means for irradiating excitation light on a first region of a semiconductor wafer;
    microwave generator means for generating microwaves;
    transmission line means, coupled to the microwave generator means, for propagating the generated microwaves and splitting the propagating generated microwaves into first and second microwave signals that propagate along first and second paths that are spatially separate from one another, respectively;
    wherein the transmission line means radiates the first microwave signal at said first region of said semiconductor wafer and radiates the second microwave signal at a second region of said semiconductor wafer that is spatially distinct from said first region of said semiconductor wafer;
    wherein first and second reflected microwave signals are formed by portions of said first and second microwave signals, respectively, that are reflected from said first and second regions of said semiconductor wafer, respectively;

detecting means for detecting intensity of said first and second reflected microwave signals; and calculating means for calculating the lifetime of minority carriers of said semiconductor wafer from the detected intensity of said first and second reflected microwave signals.

2. An apparatus according to claim 1, wherein said detecting means comprises a first detector for detecting the first microwave signal and a second detector for detecting the second microwave signal.

3. An apparatus according to claim 1, wherein said first and second reflected microwave signals interfere with one another to form an interference signal and wherein said detector means comprises a detector for detecting said interference signal.

4. An apparatus according to claim 1, wherein said transmission line means comprises a coaxial line.

5. An apparatus according to claim 1, wherein said transmission line means comprises a waveguide structure.

6. An apparatus according to claim 5, wherein said irradiating means and said waveguide structure are positioned relative to one another so that said excitation light propagates from said irradiation means to said semiconductor wafer inside of said waveguide structure.

7. An apparatus according to claim 5, wherein said transmission line means comprises line length varying means for varying the length of said second path.

8. An apparatus according to claim 5 wherein said detector means comprises a mixer.

9. An apparatus according to claim 5, wherein said transmission line means comprises a magic T.

10. An apparatus according to claim 1, wherein a length difference of (a) the path length of the first microwave signal plus the path length of the first reflected microwave signal and (b) the path length of the second microwave signal and the second reflected microwave signal is a half wavelength or the sum of a half wavelength and an integer number of wavelengths.

11. An apparatus according to claim 1, wherein length of
(a) the path length of the first microwave signal plus the path length of the first reflected microwave signal and
(b) the path length of the second microwave signal and the second reflected microwave signal, are the same.

12. An apparatus according to claim 1, wherein said excitation light from said irradiating means has a first frequency, and further comprising a second irradiating means for irradiating said semiconductor wafer with second excitation light having a second frequency.

13. An apparatus according to claim 1, wherein said detecting means is coupled to said transmission line means so that said detecting means detects said intensity of said first and second reflected microwave signals on said transmission line means.

* * * * *